United States Patent [19]
Nakamura et al.

[11] Patent Number: 5,841,067
[45] Date of Patent: Nov. 24, 1998

[54] HOUSING FOR ELECTRONIC APPARATUS AND METHOD OF DAMPING UNWANTED RADIATION OF ELECTROMAGNETIC WAVES

[75] Inventors: Koji Nakamura, Amagasaki; Masato Morimoto, Hirakata; Mitsuyuki Oda, Kyoto; Kazunori Kanda, Yao; Yoshihiro Konishi, Sagamihara, all of Japan

[73] Assignees: Nippon Paint Co., Ltd., Osaka; K. Laboratory Co., Ltd., Sagamihara, both of Japan

[21] Appl. No.: 661,769

[22] Filed: Jun. 11, 1996

[30] Foreign Application Priority Data

Jun. 21, 1995 [JP] Japan ................................. 7-179503

[51] Int. Cl.⁶ ........................................... H05K 9/00
[52] U.S. Cl. .................................. 174/35 MS; 174/35 R
[58] Field of Search .......................... 174/35 R, 35 MS; 361/816, 818, 753, 799, 800; 455/300

[56] References Cited

U.S. PATENT DOCUMENTS 5,539,148   7/1996   Konishi et al. ...................... 174/35 R

FOREIGN PATENT DOCUMENTS 0 588 574 A1   3/1994   European Pat. Off. ......... H05K 9/00
2 198 734      6/1988   United Kingdom ............. C08K 3/00

*Primary Examiner*—Bot L. Ledynh
*Assistant Examiner*—Hung V. Ngo
*Attorney, Agent, or Firm*—Pollock, Vande Sande & Amernick

[57] ABSTRACT

A housing for electronic apparatus which is effectively protected against electromagnetic wave leakage, the housing being equipped or lined, in an area of the conductive layer-carrying inside surface of the housing, the area adjoining, or is in the vicinity of, an opening of the housing, with a sheet molded, to a thickness of 70 to 300 μm, from a magnetic material-containing resin composition comprising 7 to 60% by weight of a binder resin (a) and 40 to 93% by weight of a finely divided magnetic material (b) having a magnetic loss term, and a method of damping unwanted radiation of electromagnetic waves.

6 Claims, 1 Drawing Sheet

HOUSING FOR ELECTRONIC APPARATUS AND METHOD OF DAMPING UNWANTED RADIATION OF ELECTROMAGNETIC WAVES

FIELD OF THE INVENTION

The present invention relates to a housing for electronic apparatus, which is effective in damping unwanted radiation of electromagnetic waves and to a method of damping unwanted radiation of electromagnetic waves.

BACKGROUND OF THE INVENTION

Housings for electronic apparatus are generally constituted of a lightweight material having good moldability, namely a synthetic resin, a sheet of such a metal as aluminum, or a composite thereof.

Electronic apparatus may be equipped with some internal circuits and electric parts that generate undesired electromagnetic waves causative of radio interference such as noises, distorted image reproduction or the like. In particular, many of the apparatus for communication or information processing and the electronic apparatus containing integrated circuits, among others, process high-frequency signals and therefore may cause high frequency leakage, leading to radio interference. Thus, in such countries as Japan, the United States of America, European countries and elsewhere, where abundant opportunities are available to use such apparatus, the regulations against high frequency leakage are being more and more reinforced.

When housings for electronic apparatus are made of synthetic resin, the above-mentioned electromagnetic wave leakage is remarkable, causing radio interference, because synthetic resin easily transmits electromagnetic waves. For preventing electromagnetic wave leakage, contrivances have so far been made which comprise using electromagnetic wave shielding resin compositions prepared by adding, to synthetic resins, a finely divided metal or other material capable of shielding electromagnetic waves. In this case, however, the material cost increases and the moldability and other properties of the synthetic resins are deteriorated, although the electromagnetic wave leakage can be prevented to a certain extent.

It has been proposed, therefore, to provide a conductive layer consisting of a metal plating or a conductive paint on the inside surface of a housing made of an ordinary electromagnetic wave-transmitting synthetic resin. Such layer can reflect electromagnetic waves and can prevent the electromagnetic waves generated within the housing from leaking out of the housing by reflecting said waves. FIG. 2 schematically shows the constitution of a housing provided or lined with such an electromagnetic wave shielding structure of the prior art proposal, wherein, within a housing 10 made of synthetic resin, there is a conductive layer 20 formed from a metal plating or a conductive paint. An electromagnetic wave generated from an electromagnetic wave source 12 are reflected on the inside surface of the conductive layer 20, so that said wave cannot leak out of the housing 10 through the wall thereof.

When the housings are formed from a thin sheet of a metal such as aluminum, it is not always necessary to provide a conductive layer for reflecting electromagnetic waves. Various measures are being taken, however, to avoid the leakage of the electromagnetic waves generated by sources thereof.

As shown in FIG. 2, the housings for electronic apparatus generally have one or more openings 14 for such purposes as ventilation and interior inspection. At the places where the housings made of a synthetic resin or a metal have a conductive layer 20, electromagnetic waves will not leak out but will be repeatedly reflected. It is highly possible that such repeatedly reflected electromagnetic waves be generated within the electronic apparatus and, moreover, said waves are within the frequency range of about 0.3 to 3 GHz, which is highly causative of radio interference. Most of the electromagnetic wave readily escapes from the housings even through very small opening or slit which the housings have. It is therefore difficult to stop leakage of such high-frequency electromagnetic waves.

Furthermore, when a conductive layer is provided on the inside surface of a housing made of a synthetic resin or a metal, the electromagnetic waves generated within the housing, while being repeatedly reflected by the conductive layer, enter all over the inner surface of the housing and eventually leak out through an opening or openings. In addition, the conductive layer acts as if it were a half-wave antenna, and emit, as well, electromagnetic waves which are originally emitted from a local oscillator within the housing. Therefore, lining with a conductive layer is not a very effective means for shielding electro magnetic waves. Accordingly, improvements are desired.

Japanese Kokai Publication Hei-6-97691 discloses a magnetic wave shielding structure the housing and the substrate of which are constituted of a sheet-like material rendered conductive on at least one side thereof and the conductive surface of the sheet-like material is coated with a thin film containing a ferrite powder capable of causing a magnetic loss to thereby prevent undesired leakage of the electromagnetic waves generated from the electronic circuit or circuits formed on the substrate accommodated in the housing. However, in view of the recent tendency toward miniaturization of electronic apparatus, the size and volume of the parts which are to be provided in the housing become a serious problem. Furthermore, in forming said thin film, a solvent-containing paint composition is applied and, therefore, it is necessary to perform masking beforehand so that the paint composition may not stain the places where the thin film is not required. It is also problematic that, the housing, when built up following placing of the substrate carrying electronic circuits, takes a three-dimensional form inside, so that adequate coating can hardly be attained using such a solvent-containing paint composition; it is also difficult to control the film thickness of said paint composition. Thus, it is difficult to obtain the desired effect with good reproducibility.

Furthermore, since the places to be coated are not always specifiable to perfection, leakage of undesired electromagnetic waves may sometimes occur even after the coating treatment.

EP-A-0398672 discloses magnetic sheets having a thickness of 375 µm to 37.5 mm and capable of suppressing unwanted radiation. Since, however, these sheets have a thickness not less than 375 µm, their use is undesirable from the viewpoint of miniaturization of electronic apparatus and/or reduction in thickness of electronic apparatus to which they are to be applied.

In addition to those mentioned above, other measures are also employed. For example, one method comprises incorporating a noise filter or ferrite beads into the electronic circuit itself, and another one comprises adding a magnetic material to a conductive shield to thereby prevent leakage through slits. However, these measures each has a problem; they extremely render it difficult to build up housings for electronic apparatus, or their effects are reproducible only to an unsatisfactory extent, or they cannot fully cope with the trend toward miniaturization of the housings.

Furthermore, such sheets are required to be resistant to cracking upon bending in an O or T manner, for instance, on the occasion of setting thereof.

In view of the foregoing state of the art, it is an object of the present invention to provide a housing for electronic apparatus which is effectively protected against electromagnetic wave leakage in spite of the existence of an opening or openings in a housing for electronic apparatus, and which has good flexibility and, in particular, can cope with the trend toward miniaturization of electronic apparatus as well as a method of damping unwanted radiation of electromagnetic waves.

SUMMARY OF THE INVENTION

The gist of the present invention consists in that, in forming a housing for electronic apparatus, the housing is equipped or lined, in an area of the conductive layer-carrying inside surface of the housing, said area adjoining, or being in the vicinity of, an opening of the housing, with a sheet molded, to a thickness of 70 to 300 $\mu$m, from a magnetic material-containing resin composition comprising 7 to 60% by weight of a binder resin (a) and 40 to 93% by weight of a finely divided magnetic material (b) having a magnetic loss term.

The gist of the present invention consists also in that, in forming a housing for electronic apparatus, the housing is equipped or lined, in an area of the conductive layer-carrying inside surface of the housing, said area adjoining, or being in the vicinity of, an opening of the housing, and further in an area or areas other than said area of the conductive layer-carrying inside surface of the housing, said area adjoining, or being in the vicinity of, the opening of the housing, with a sheet molded, to a thickness of 70 to 300 $\mu$m, from a magnetic material-containing resin composition comprising 7 to 60% by weight of a binder resin (a) and 40 to 93% by weight of a finely divided magnetic material (b) having a magnetic loss term.

In a further aspect, the gist of the present invention consists in that, as a method of damping unwanted radiation of electromagnetic waves, the method comprises using a housing for electronic apparatus equipped or lined, in an area of the conductive layer-carrying inside surface of the housing, said area adjoining, or being in the vicinity of, an opening of the housing, with a sheet molded, to a thickness of 70 to 300 $\mu$m, from a magnetic material-containing resin composition comprising 7 to 60% by weight of a binder resin (a) and 40 to 93% by weight of a finely divided magnetic material (b) having a magnetic loss term, to thereby prevent undesirable leakage of electromagnetic waves from the opening of the housing for electronic apparatus.

Figure 1:
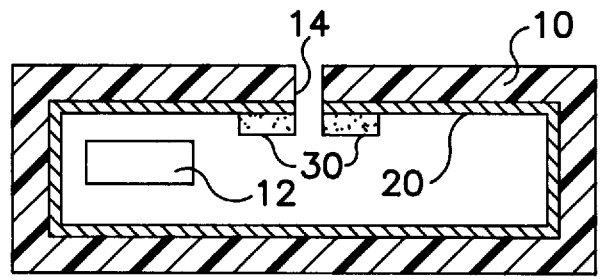
FIG. 1 schematically shows, in cross-section, the constitution of a housing for electronic apparatus according to the present invention.
Figure 2:
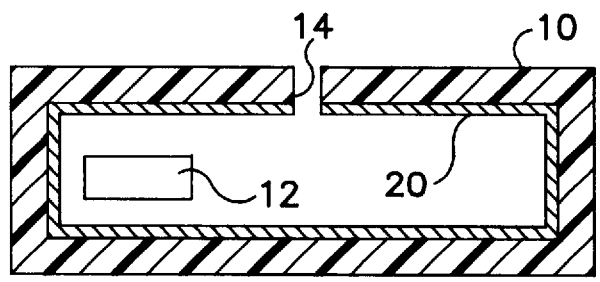
FIG. 2 schematically shows, in cross-section, the constitution of an example of the prior art housings for electronic apparatus.

In the figures, the reference number 10 stands for the housing, 12 for an electromagnetic wave source, 14 for an opening, 15 for an area where the intensity of the magnetic field due to the electromagnetic wave source becomes maximal, 20 for a conductive layer, and 30 for a sheet molded from a magnetic material-containing resin composition.

DETAILED DESCRIPTION OF THE INVENTION

The sheet to be used in accordance with the present invention is prepared by molding, to a thickness of 70 to 300 $\mu$m, from a magnetic material-containing resin composition comprising 7 to 60% by weight of a binder resin (a) and 40 to 93% by weight of a finely divided magnetic material (b) having a magnetic loss term.

Either a thermosetting resin or a thermoplastic resin may be used as the binder resin (a) mentioned above. The use of a thermoplastic resin is preferred, however. The thermoplastic resin is not limited to any particular species but includes, for instance, nonpolar resins such as polyethylene, polypropylene, polymethylpentene, polybutene, crystalline polybutadiene, polystyrene, polybutadiene and styrene-butadiene copolymers; such resins as polyvinyl chloride, polyvinyl acetate, polymethyl methacrylate, polyvinylidene chloride, polytetrachloroethylene, ethylene-vinyl acetate copolymers, modified ethylene-vinyl acetate copolymers, ethylene-vinyl acetate-vinyl chloride graft copolymer, chlorinated polyethylene, styrene-acrylonitrile copolymer (SAN resins), acrylonitrile-butadiene-styrene copolymer (ABS resins), acrylate-styrene-acrylonitrile copolymer (ASA resins), chlorinated polyethylene-acrylonitrile-styrene copolymer (ACS resins), polyacetal, polyamide, polycarbonate, polyphenylene ether, polyethylene terephthalate, polybutyrene terephthalate, polyacrylate, polysulfone, polyimide, polyamideimide, polyphenylene sulfide, polyoxybenzoyl, polyetheretherketone, polyetherimide, silicone resins and epoxy resins; and modifications of these resins. These may be used either singly or in combination.

The above-mentioned binder resin (a) can adequately be selected taking into consideration of the wettability with the finely divided magnetic material, the viscosity and temperature in the resin kneading process, the physical properties, chemical resistance, heat resistance, water resistance, ability to adhere to metals or plastics of the film, and other factors. Preferred among others are resins selected from among ethylene-vinyl acetate copolymers, modified ethylene-vinyl acetate copolymers, ethylene-vinyl acetate-vinyl chloride graft copolymers, chlorinated polyethylene, polyvinyl chloride, polyester, acrylic resins, polyamide, silicone resins and epoxy resins as well as modified resins derived from these.

The proportion of the above binder resin (a) in the magnetic material-containing resin composition is 7 to 60% by weight. In a proportion less than 7% by weight, the producibility of sheets is insufficient, while in a proportion exceeding 60% by weight, the unwanted radiation wave-damping effect is insignificant. Hence, the above range is critical.

The finely divided magnetic material (b) having a magnetic loss term to be used in accordance with the present invention comprises at least one member selected from the group consisting of metal oxide magnetic materials having a mean particle size of 1 to 30 $\mu$m and metallic magnetic materials having a mean particle size of 1 to 30 $\mu$m. The magnetic loss term means the loss term of complex magnetic permeability.

The metal oxide magnetic materials mentioned above are not limited to any particular species but include ferrites in which $Fe_2O_3$ is combined with MnO, ZnO, NiO, MgO, CuO, $Li_2O$, etc.; spinel type ferrites such as NiO—MnO—ZnO—$Fe_2O_3$, MnO—ZnO—$Fe_2O_3$, NiO—ZnO—$Fe_2O_3$; garnet type ferrites; spinel type (cubic) gamma-$Fe_2O_3$, gamma-$Fe_4O_4$, and the like.

The above-mentioned metal oxide magnetic materials should have a mean particle size of 1 to 30 μm, preferably 1 to 5 μm.

The metallic magnetic materials mentioned above are not limited to any particular species but include pure iron-based metal powders, iron nitride powders, Fe—Si—Al alloys (Sendust), Ni—Fe alloys (Permalloy), Co—Fe alloys, Fe-based or Co-based amorphous alloys, and the like.

The above-mentioned metallic magnetic materials should have a mean particle size of 1 to 30 μm.

Among the metal oxide magnetic materials and metallic magnetic materials mentioned above, spinel type ferrites in the form of magnetic powder as resulting from the combination of $Fe_2O_3$ with MnO, ZnO, NiO and/or MgO and amorphous alloy type magnetic materials in powder form are preferred as the finely divided magnetic material (b) mentioned above. More preferred are Mn—Mg—Zn type and Mn—Zn type magnetic materials in powder form having a mean particle size of 1 to 5 μm.

The proportion of the finely divided magnetic material (b) mentioned above in the magnetic material-containing resin composition is 40 to 93% by weight. When the proportion is less than 40% by weight, the unwanted radiation wave-damping effect will be low and, when it exceeds 93% by weight, the producibility of sheets becomes short. The above range is therefore critical.

The finely divided magnetic material (b) may be surface-treated, as necessary, with a silane coupling agent, a titanate coupling agent, an aluminate coupling agent, some other additive, a resin or the like. By such treatment, functional groups which are capable of rendering the finely divided magnetic material reactive, or functional groups which are capable of influencing the wettability are introduced into said material. Therefore, employment of such treatment is preferred from viewpoints of the producibility and/or film-forming property in cases where the level of filling of the finely divided magnetic material is high or a plurality of finely divided magnetic materials are used in combination.

The additive mentioned above is not limited to any particular species but includes, for instance, surfactants, wetting agents and viscosity reducing agents for improving the wettability and/or flowability of the finely divided magnetic material, and heat stabilizers and/or antioxidants for stabilizing the resin composition in the production process, among others.

The sheet according to the present invention can be produced, for example, in the following manner.

A magnetic material-containing resin composition is prepared by kneading together the binder resin, the finely divided magnetic material surface-treated when necessary and one or more other additives in a roll, Banbury mixer, pressure kneader or the like. The resin composition is further molded into a sheet using a pressure press, calender roll, extruder or the like. When a resin plasticized with a plasticizer, for example a vinyl chloride resin, or a resin dissolved or dispersed in an organic solvent or water as necessary is used, the solution or paste containing the finely divided magnetic material may be applied using a known coater, followed by removal of the volatile matter, to give a sheet.

The sheet mentioned above has a thickness of 70 to 300 μm. When it is less than 70 μm, the effect of damping unwanted radiation of electromagnetic waves will be insignificant. When it exceeds 300 μm, the thickness imposes limitations on the apparatus or places to or at which the sheet is to be applied, the range of application is thus limited, the installment of the sheet corresponding to the shape of the housing becomes difficult, and the uniformity in sheet production is impaired, although no problem is encountered with respect to the effect of damping unwanted radiation of electromagnetic waves. The above range is thus critical. A preferred range is 120 to 250 μm.

The housing for electronic apparatus according to the present invention is equipped or lined with the above-mentioned sheet in an area of the conductive layer-carrying inside surface of the housing, said area adjoining or being in the vicinity of each opening.

The above-mentioned conductive layer-carrying housing for electronic apparatus is produced from an electromagnetic wave-transmitting material such as a synthetic resin, wooden material or inorganic material. Said synthetic resin may be any of ordinary resins suited for molding.

Generally, the conductive layer to be formed on the inside surface of the housing for electronic apparatus may be an ordinary electromagnetic wave-reflecting material already used in the electromagnetic wave-shielding structure so far proposed, and the technique for forming the conductive layer on the inside surface of the housing may be any of the conventional techniques. Thus, mention may be made of, for instance, the method comprising plating the inside surface of the housing with a conductive metal such as copper or aluminum, and molding such a metal into a thin film by the technique of vapor deposition or the like and applying the resulting foil to said surface, the method comprising applying various conductive paint compositions prepared by mixing a finely divided metal or the like with paints, and the method comprising sticking a film made of a conductive resin to said surface using an adhesive or pressure sensitive adhesive. The thickness of the conductive layer may vary depending on the frequency and intensity of the electromagnetic waves to be generated within the housing and on the combination with the sheet mentioned above. Generally, however, a thickness of 40 to 60 μm is preferred.

As for the shape and structure of the housing, use may be made of any shape and structure arbitrarily selected so as to conform to the entire structure of the electronic apparatus. An opening, such as a slit, hole or notch, for the functioning of the electronic apparatus may be present in at least a portion of the housing.

The opening of the housing for electronic apparatus mentioned above means any opening provided for the purpose of input and output of signals, current, power, and other optical or physical energies required for the operation of the electronic apparatus, including an opening or openings provided for cooling the apparatus or any opening communicating the interior of the housing with the exterior as may be formed in the fabrication of the housing, such as an opening formed at a joint or junction of the housing, in any of various display devices for displaying picture images utilizing cathode rays, liquid crystals, light emitting diodes (LEDs), etc.; instruction display devices for the operator; receiving units of remote control systems; terminal devices for the input and output of signals, electric power, light, radio waves, etc.; battery power supply units; speaker units; compact discs (CDs), CD-ROMs, floppy disks, cassette tapes, disks, minidisks, and so forth.

The inside surface of the housing is equipped or lined, in an area adjoining or being in the vicinity of an opening, with the sheet according to the present invention. The area to be equipped or lined with the sheet preferably adjoins the opening, as shown in FIG. 1. Even if the area in the vicinity of the opening is away from the opening by not more than 10 mm, however, a nearly equivalent effect can be obtained as compared with the case where said area adjoins the opening. When the area is away from the opening by more than 10 mm, the effect of damping unwanted radiation of electromagnetic waves will be very slight. More preferably, the distance between the area and the opening is not more than 5 mm.

In cases where the housing for electronic apparatus has a plurality of openings, the sheet should be applied to areas respectively adjoining the openings.

Figure 3:
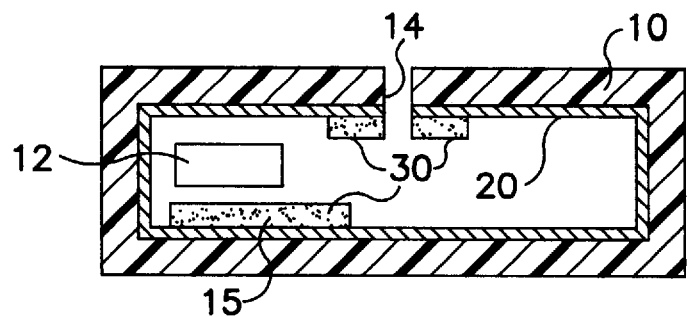
FIG. 3 schematically shows, in cross-section, the constitution of the housing produced in Example 2.

Furthermore, as shown in FIG. 3, the housing for electronic apparatus according to the present invention is equipped or lined with the above-mentioned sheet in an area of the inside surface of the housing, said area adjoining or being in the vicinity of an opening, and further in an area or areas other than the area adjoining or being in the vicinity of the opening. Said area or areas other than the area adjoining or being in the vicinity of the opening to which the above-mentioned sheet is equipped or lined preferably include an area where the magnetic field becomes maximal, an area in the vicinity of an electronic circuit substrate or an electromagnetic wave source unit, an area covering the whole or part of a joint or junction resulting from fabrication of the housing, and other areas. It is not desirable to cover the entire inside surface of the housing with the sheet mentioned above, since the intensity of unwanted radiation of electromagnetic waves increases as compared with the case where the sheet is not provided at all. Therefore, in the present invention, only the part of the inside surface of the housing is covered with the sheet.

The method of fixing the sheet according to the invention is not critical. Thus, examples are given that the sheet may be caused to adhere to the inside surface of the housing by means of a tape coated with a pressure sensitive adhesive on both sides, an adhesive composition or the like, or the sheet may be united to the housing using a high-frequency sewing machine, a hot press or the like, or the sheet may be put on the inside surface of the housing and fixed thereto using an adhesive tape or the like film or with fittings or parts for fixation.

The housing for electronic apparatus according to the present invention can be used in communication apparatus such as car phones, portable phones, PHS phones, terminals for wireless local area networks (LANs), adapters and point-of-sale (POS) control terminals; office apparatus such as personal computers, word processors and small-sized computers; players for CDs, CD-ROMs, minidisks, laser disks and digital videodisks (DVDs); household electric appliances such as audiovisual game machines, small-sized radios and televisions; digital compact cassettes (DCCs); cassette recorders; and apparatus in which a clock rate or pulse is generated.

The method of damping unwanted radiation of electromagnetic waves according to the present invention is carried out by using a housing for electronic apparatus equipped or lined, in an area of the conductive layer-carrying inside surface of the housing, said area adjoining or being in the vicinity of an opening, with a sheet molded, to a thickness of 70 to 300 µm, from a magnetic material-containing resin composition comprising 7 to 60% by weight of a binder resin (a) and 40 to 93% by weight of a finely divided magnetic material (b) having a magnetic loss term to thereby prevent undesirable leakage of electromagnetic waves from the opening of the housing for electronic apparatus.

The use, in accordance with the present invention, of a housing equipped or lined, in an area of the conductive layer-carrying inside surface of the housing which area adjoins or is in the vicinity of an opening, with a sheet molded, to a thickness of 70 to 300 µm, from a magnetic material-containing resin composition comprising 7 to 60% by weight of a binder resin (a) and 40 to 93% by weight of a finely divided magnetic material (b) having a magnetic loss term makes it possible to prevent undesirable leakage of electromagnetic waves from the opening of the housing for electronic apparatus, hence makes it possible to damp unwanted radiation of electromagnetic waves.

Even when the housing for electronic apparatus according to the present invention contains an electronic circuit having an electromagnetic wave source and has an opening or the like which otherwise would serve as an opening for electromagnetic wave leakage, the undesirable electromagnetic wave leakage can be readily prevented to thereby reduce the occurrence of radio interference. In particular, the present invention has overcome the problems involved in the prior art technology disclosed in Japanese Kokai Publication Hei-6-97691, namely the insufficient incorporation of the shielding devices into miniaturized housings for electronic apparatus, and the insufficient effect of the magnetic loss and the poor reproducibility in spite of the formation, within the housing, of a thin film containing a ferrite powder causing a magnetic loss. Thus, in accordance with the present invention, the leakage of unwanted electromagnetic waves from the housing for electronic apparatus can be significantly prevented and the ability of incorporation of the shielding devices into miniaturized housings can be very much improved by equipping or lining a sheet comprising a binder resin and a finely divided magnetic material having a magnetic loss term in an area of the conductive layer-carrying inside surface of the housing, said area adjoining or being in the vicinity of an opening.

When the lower of the frequencies for which the values of the real number term and imaginary number term of the magnetic permeability of the sheet comprising the binder resin (a) and the finely divided magnetic material (b) having a magnetic loss term become equal is defined as fr and when the unwanted radiation from the housing has a frequency lower than fr, equipping or lining the sheet in an area of the inside surface of the housing which area adjoins or is in the vicinity of an opening can produce a particularly remarkable effect of damping unwanted radiation waves.

The values of the real number term and imaginary number term of the permeability can be readily determined using a network analyzer. Thus, by measuring the fr values of the sheets produced, it is possible to select, from among them, a sheet effective for the frequency of the unwanted radiation from the housing for electronic apparatus.

According to the present invention, the increase in unwanted radiation wave-damping effect is resulted from the provision of the sheet molded from a magnetic material-containing resin composition comprising a binder resin and a finely divided magnetic material having a magnetic loss term in an area which adjoins or is in the vicinity of an opening of the conductive layer-carrying inside surface of the housing for electronic apparatus. The cause of the effect is not yet clear. However, it can be reasonable to think as follows. Unwanted radiation waves are generated from the housing for electronic apparatus as a mixture of radio waves emitted from the devices and/or the substrate within the housing, radio waves generated by cavity resonance of said radio waves within the housing, and radio waves generated by further resonance thereof. Among them, the radiation waves generated particularly from the opening or the conductive surface in the vicinity of the opening are considered to be main. Therefore, it is presumable that the area adjoining or in the vicinity of the opening, when provided, in accordance with the invention, with a sheet made of a magnetic material having a magnetic loss term-containing resin composition, and modify the spatial radiation patterns of the radio waves generated from said area.

The housing for electronic apparatus according to the present invention, which has the above-mentioned constitution, can reliably prevent electromagnetic wave leakage even when the housing has an opening or openings by applying the sheet containing a magnetic materials having a magnetic loss term to a limited area which adjoins the opening of openings. In addition, it has good flexibility. Thus, the present invention can provide housings for electronic apparatus and a method of damping unwanted radiation of electromagnetic waves, with which and by which the current trend toward miniaturization of electronic apparatus can be well coped with.

EXAMPLES

The following examples are further illustrative of the present invention but are by no means limitative of the scope of the present invention.

Example 1

An EVA (ethylene-vinyl acetate) resin (SUMITATE RB-11 (trade name), manufactured by Sumitomo Chemical Co., Ltd.) was used as the binder resin, and a Mn—Zn ferrite powder as the finely divided magnetic material. A kneaded mass was prepared by kneading 10 parts by weight of the binder resin and 50 parts by weight of the finely divided magnetic material using a test roll set at 110° C. Then, an appropriate quantity of the kneaded mass was taken, rolled on a hot press at 110° C. and molded into a sheet on a hot pressure roll at 140° C. to give a thickness distribution of 270±30 $\mu$m.

The sheet obtained was tested for flexibility by folding in two. It was found to have sufficient flexibility, without any sign of breakage or cracking. The fr value of the sheet obtained, when measured with a network analyzer, was 1.3 GHz.

The sheet obtained was cut to the size of 1 cm×3 cm and applied, as illustrated in FIG. 1, to an area which is adjoining the opening of a housing for electronic apparatus, using a tape coated with a pressure sensitive adhesive on both sides. The tape thickness was 30 $\mu$m. The unwanted radiation intensity was measured in a simplified radio wave dark room essentially by the 3 meter method and found to be 44 dB $\mu$V/m at 796 MHz.

Comparative Example 1

The same housing as used in Example 1 was used without providing the sheet. The unwanted radiation intensity measured by the same method as in Example 1 was 48 dB $\mu$V/m at 796 MHz.

Example 2

Vinyl chloride resin pellets were prepared by mixing 100 parts by weight of a vinyl chloride resin, 30 parts by weight of a plasticizer, 1 part by weight of a zn- and Ba-based heat stabilizer and 2 parts by weight of epoxidized soybean oil. Further, 1197 parts by weight of a Mn—Mg—Zn ferrite powder was incorporated into the pellets in a pressure kneader to give a compound, which was then molded into a sheet by extruding through the die of an extruder. The sheet had a thickness distribution of 250±50 $\mu$m. The fr value of the sheet obtained, as measured with a network analyzer, was 0.7 GHz.

The sheet was applied, as illustrated in FIG. 3, to an area 14 adjoining the opening and to an area 15 of the housing where the intensity of the magnetic field due to an electromagnetic wave source 12 becomes maximal, by the same method as used in Example 1, and the unwanted radiation intensity was measured by the same method as used in Example 1. It was 43 dB$\mu$V/m at 450 MHz.

Comparative Example 2

The same housing as used in Example 2 was used without providing the sheet. The unwanted radiation intensity measured by the same method as in Example 1 was 49 dB $\mu$V/m at 450 MHz.

Example 3

A 150-$\mu$m-thick sheet was produced in the same manner as in Example 1 except that 10 parts by weight of chlorinated polyethylene was used in lieu of EVA and 90 parts by weight of a Mn—Zn ferrite powder in lieu of the Mn—Mg—Zn ferrite powder. Such sheet was applied to an area away from the opening by 5 mm, and the unwanted radiation intensity was measured by the same method as used in Example 1 and found to be 45 dB $\mu$V/m at 796 MHz.

Example 4

A sheet was produced in the same manner as in Example 1 except that an ethylene-vinyl acetate-vinyl chloride copolymer was used in lieu of EVA. The sheet was applied to a housing in the same manner as in Example 1, and the unwanted radiation intensity was measured and found to be 45 dB $\mu$V/m at 796 MHz.

We claim:

1. A case for electronic apparatus comprising a housing having an opening; a conductive layer disposed on an inner surface of said housing; a sheet being in the vicinity of said opening having a thickness of 70 to 400 $\mu$m, formed of a magnetic material containing resin composition comprising 7 to 60% by weight of a binder resin (a) and 40 to 93% by weight of a finely divided magnetic material (b) having a magnetic loss term; wherein the sheet is disposed only on a portion of said housing.

2. A housing for electronic apparatus according to claim 1, wherein the binder resin (a) comprises at least one member selected from the group consisting of ethylene-vinyl acetate copolymers, modified ethylene-vinyl acetate copolymers, ethylene-vinyl acetate-vinyl chloride graft copolymers, chlorinated polyethylene, polyvinyl chloride, polyester, acrylic resins, polyamide, silicone resins and epoxy resins.

3. A housing for electronic apparatus according to claim 1, wherein the finely divided magnetic material (b) having a magnetic loss term comprises at least one member selected from the group consisting of metal oxide magnetic materials having a mean particle size of 1 to 30 $\mu$m and metallic magnetic materials having a mean particle size of 1 to 30 $\mu$m.

4. A housing for electronic apparatus according to claim 1, wherein the finely divided magnetic material (b) having a magnetic loss term is a spinel type magnetic iron oxide containing Mn, Ni, Zn and/or Mg, or an amorphous magnetic metal powder.

5. A housing for electronic apparatus according to claim 1, wherein the area in the vicinity of the opening is away from the opening by not more than 10 mm.

6. A method of damping unwanted radiation electromagnetic waves which comprises using a case for electronic apparatus comprising a housing having an opening; a conductive layer disposed on an inner surface of said housing; a sheet being in the vicinity of said opening having a thickness of 70 to 300 μm formed of a magnetic material-containing resin composition comprising 7 to 60% by weight of a binder resin (a) and 40 to 93% by weight of a finely divided magnetic material (b) having a magnetic loss term, wherein the sheet is disposed only on a portion of said housing to thereby prevent undesirable leakage of electromagnetic waves from said opening.

* * * * *